United States Patent
Chiu et al.

(10) Patent No.: US 9,098,662 B1
(45) Date of Patent: Aug. 4, 2015

(54) CONFIGURING A DEVICE TO DEBUG SYSTEMS IN REAL-TIME

(71) Applicant: Altera Corporation, San Jose, CA (US)

(72) Inventors: Gordon Raymond Chiu, North York (CA); Jason Peters, Toronto (CA); David Ian Milton, Oshawa (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/012,827

(22) Filed: Aug. 28, 2013

(51) Int. Cl.
*G06F 17/50* (2006.01)

(52) U.S. Cl.
CPC ........ *G06F 17/5045* (2013.01); *G06F 17/5027* (2013.01); *G06F 17/5054* (2013.01); *G06F 17/5081* (2013.01)

(58) Field of Classification Search
CPC ............ G06F 17/5054; G06F 17/5027; G06F 17/5045; G06F 17/5081
USPC ............. 716/100, 116, 117, 121, 128; 703/16
See application file for complete search history.

(56) References Cited

U.S. PATENT DOCUMENTS

| | | | |
|---|---|---|---|
| 6,915,494 B2* | 7/2005 | Shigeta | 716/106 |
| 7,373,621 B1* | 5/2008 | Dastidar | 714/726 |
| 7,406,670 B1* | 7/2008 | Ansari et al. | 716/136 |
| 7,595,655 B2* | 9/2009 | Hutchings et al. | 326/16 |
| 8,069,373 B2* | 11/2011 | Vorbach | 714/38.1 |
| 8,415,974 B1* | 4/2013 | Lysaght | 326/39 |
| 8,595,555 B1* | 11/2013 | Taylor | 714/30 |
| 2009/0150725 A1* | 6/2009 | Vorbach | 714/37 |
| 2011/0060546 A1* | 3/2011 | Miller et al. | 702/120 |

OTHER PUBLICATIONS

Altera Corporation 2010. "Increasing Design Functionality with Partial and Dynamic Reconfiguration in 28-nm FPGAs," WP-01137-1.0 pp. 1-9, Jul. 2010.

* cited by examiner

*Primary Examiner* — Phallaka Kik
(74) *Attorney, Agent, or Firm* — Weaver Austin Villeneuve & Sampson LLP

(57) ABSTRACT

Techniques and mechanisms allow a device such as a programmable logic device (PLD) to support real-time debugging of a system. The PLD may be configured to include a debug design without disturbing the configuration of a base logic design in the PLD.

22 Claims, 10 Drawing Sheets

CONFIGURING A DEVICE TO DEBUG SYSTEMS IN REAL-TIME

TECHNICAL FIELD

This disclosure generally relates to integrated circuits. More specifically, the disclosure relates to systems and methods for debugging a programmable logic device (PLD).

DESCRIPTION OF THE RELATED TECHNOLOGY

A programmable logic device (PLD) is a semiconductor integrated circuit which contains logic circuitry and routing that may be configured to perform a host of logic functions. In a typical scenario, a designer uses electronic design automation (EDA) tools to create a design. These tools use information regarding the hardware capabilities of a given programmable logic device to help the designer implement the custom logic using multiple resources available on that given programmable logic device.

In some scenarios, a designer of a PLD may wish to debug a system. For instance, a functional failure may be detected, such as an output providing incorrect data. Accordingly, the designer may wish to isolate the source of the functional failure to a particular interconnect or logic.

SUMMARY

The subject matter described herein provides a technique for a device, such as a programmable logic device (PLD), to support debugging a system in real-time using, for example, partial reconfiguration.

In some scenarios, a designer of a PLD may wish to debug a system in real-time. For instance, a functional failure may be detected, such as an output providing incorrect data. Accordingly, the designer may wish to isolate the source of the functional failure to a particular interconnect or logic. If a particular interconnect is to be sampled to isolate a functional failure, a design may be modified to "tap" the interconnect and allow the designer to observe the state of the signal associated with the interconnect.

However, configuring a PLD with a tap at the interconnect to be sampled may cause the failure condition to reset. For example, creating a new configuration file or data with the tap to debug the design may require resetting the PLD. That is, a new design with the modification (i.e., the tap at the interconnect) may be compiled, a new configuration file may be generated, and the PLD may be configured with the new configuration file and reset. Accordingly, after the reset, the designer may have to wait for the failure to reoccur.

Allowing a PLD to support real-time debug without a reset of the PLD with the failure may be advantageous. For instance, the PLD may be debugged while the failure is present and, therefore, avoid having to wait for the failure to reoccur.

In one example, a configuration file or data including a logic design may be received. The PLD may be configured with the logic design. A second configuration file or data including a debug design tapping an interconnect of the logic design may also be provided. Partial reconfiguration may be used to configure the PLD to include the debug design without disturbing the configuration of the logic design in the PLD. Accordingly, the PLD may be debugged in real-time.

These and other features will be presented in more detail in the following specification and the accompanying figures, which illustrate by way of example.

DETAILED DESCRIPTION OF PARTICULAR EMBODIMENTS

The techniques and mechanisms disclosed herein are primarily described with reference to programmable logic devices (PLDs) such as Field Programmable Gate Arrays (FPGAs), but are not necessarily limited to PLDs.

Figure 1A:
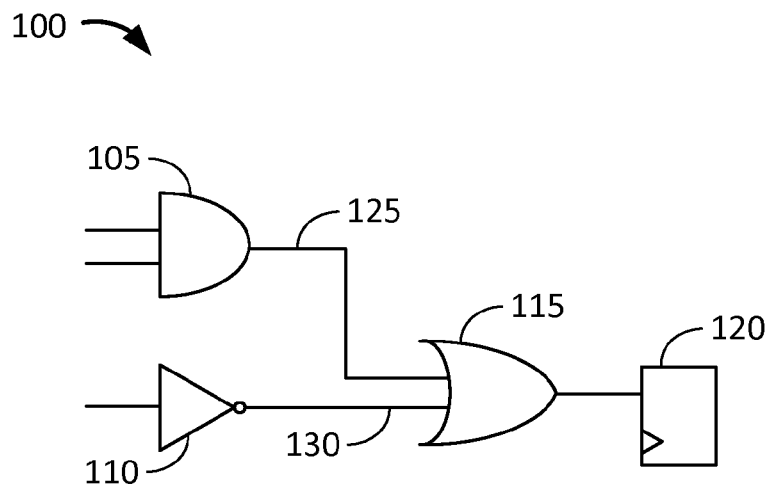
FIG. 1A illustrates a circuit schematic of a logic design in accordance with some implementations.

FIG. 1A illustrates an example of a logic design 100 configured in a PLD. In FIG. 1A, logic design 100 includes AND gate 105, inverter 110, OR gate 115, and register 120. The output of AND gate 105 is coupled to an input of OR gate 115 with interconnect 125. The output of inverter 110 is coupled to another input of OR gate 115 with interconnect 130. In other implementations, in addition to logic gates, a logic design may also include look-up tables (LUTs), shift registers, digital signal processing (DSP) blocks, memories including read-only memories (ROMs) and random-access memories (RAMs), transceivers, inputs/outputs (IOs), central processing units (CPUs), and other functionality. Logic designs may also include a variety of hard or hardened logic (e.g., fixed circuitry) and soft logic (e.g., functionality implemented in the configurable logic of a PLD).

In an implementation, the logic design 100 may be configured in the PLD by configuring, or programming, a variety of configuration elements such as configuration random access memory (CRAM) cells, antifuses, fuses, flash memory, and other elements that may be configured. The configuration elements may be configured to provide the functionality and routing by providing the signals (e.g., biasing high or low) to logic in the PLD such that logic design 100 may be implemented.

Figure 1B:
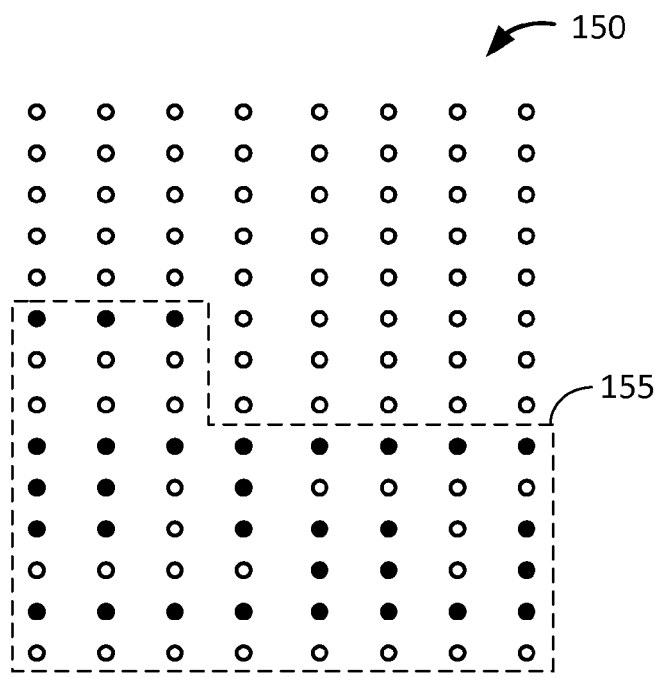
FIG. 1B illustrates a distribution of configuration random access memory (CRAM) cells associated with the schematic of FIG. 1A in accordance with some implementations.

For example, FIG. 1B illustrates a simplified example of a distribution 150 of CRAM cells associated with the schematic of FIG. 1A. In FIG. 1B, distribution 150 includes a variety of CRAM cells. Distribution 155 is a subset of the CRAM cells of distribution 150 that may be associated with logic design 100 of FIG. 1A. That is, the configuration of the CRAM cells in distribution 155 may provide the functionality and routing of AND gate 105, inverter 110, OR gate 115, and register 120, as well as the routing between the logic (e.g., interconnects 125 and 130). In an implementation, a PLD may be configured using a configuration file or bitstream data indicating the configuration of CRAM cells. The bitstream data may be loaded into a data register circuit used to configure the PLD. A bit in the bitstream data may be associated with a particular CRAM cell. In some implementations, the CRAM cells may be addressed and configured group-by-group until the PLD is configured.

In some scenarios, a designer of the PLD may wish to debug a system, such as logic design 100, in real-time. For example, if the output of register 120 is provided to an Input/Output (I/O) buffer and is observed (e.g., with an oscilloscope or logic analyzer) to be stuck high rather than toggling, the designer may wish to isolate the source of the failure (i.e., the source of the failure causing the output to be stuck high). For example, an interconnect that is shorted to a high or low logic level, a timing failure, a functional failure of a design, or other types of failures may need to be isolated. Accordingly, the designer may wish to tap, or sample, internal nets (e.g., the interconnect between OR gate 115 and register 120, interconnect 125, interconnect 130) and observe the state of the signals in order to isolate the failure. For example, the designer may want to incrementally tap signals and follow a failure to its source. That is, in the example of logic design 100, the designer may wish to follow the failure from the output of register 120 to the source by checking the signals at the interconnect between OR gate 115 and register 120, interconnect 125, interconnect 130, and so forth. The designer may first tap the interconnect between OR gate 115 and register 120. Next, if tapping the interconnect between OR gate 115 and register 120 is not believed to isolate the failure, the designer may tap interconnect 125. If interconnect 125 is providing an expected signal, interconnect 130 may be tapped to see if it is providing incorrect data.

Accordingly, the designer may modify the original logic design and include taps of interconnects to observe the signals. However, in some systems, modifying the design involves creating a new configuration file and reconfiguring all of the CRAM cells. Reconfiguring all of the CRAM cells involves "freezing" the PLD and subsequently configuring all the CRAM cells. Once all of the CRAM cells are configured, the PLD may be reset and allowed to operate as configured. However, reconfiguring all of the CRAM cells and resetting the PLD may cause certain failures to also reset. For example, some intermittent functional failures may manifest weeks or months after the PLD has begun running. If a logic design is modified so that an interconnect is tapped and the PLD is reset, the failure may disappear and the designer may need to wait for the failure to occur.

Figure 2A:
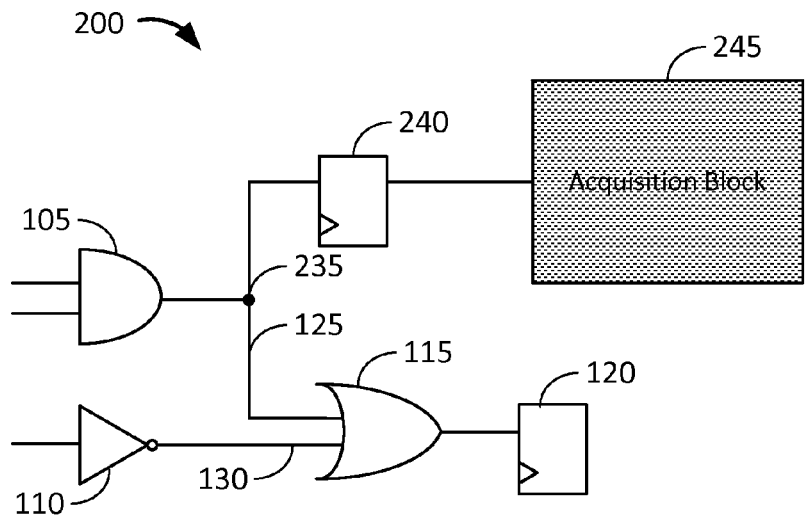
FIG. 2A illustrates a circuit schematic of the logic design of FIG. 1A with debug logic in accordance with some implementations.

However, with techniques such as partial reconfiguration, a specific subset of CRAM cells may be configured rather than freezing the entire PLD and configuring all of the CRAM cells. Accordingly, logic design 100 may be tapped without losing the functional failure. In an implementation, a particular interconnect may be selected to be sampled or observed. For example, FIG. 2A illustrates a circuit schematic of the logic design of FIG. 1A with debug logic in accordance with some implementations. Logic design 200 includes logic design 100 as a base or original design. That is, logic design 200 includes AND gate 105, inverter 110, OR gate 115, and register 120. The interconnect (e.g., interconnect 125, 130, etc.) between the elements may also be preserved. However, logic design 200 also includes a debug design added to logic design 100. In FIG. 2A, the debug design includes an interconnect such as a tap 235 provided to a register 240. Register 240 may sample data at interconnect 125. The sampled data may be provided to an acquisition block 245, where the data may be stored. In some implementations, the acquisition block may be configured to store the sampled data into on-chip memory such as static random access memory (SRAM) or another device, such as an off-chip memory device. In an implementation, the sampled data may be stored and later read through a Joint Test Action Group (JTAG) interface to a host computer. The data may then be inspected through a number of software applications (e.g., a waveform viewer).

In some implementations, the design changes associated with the debug design may be added during run-time. That is, the PLD may be operational with the original logic design 100. If the designer wants to sample interconnect 125, tap 235, register 240, and acquisition block 245 may be added without resetting the PLD and disturbing logic design 100, and therefore, maintaining a state of a failure.

Figure 2B:
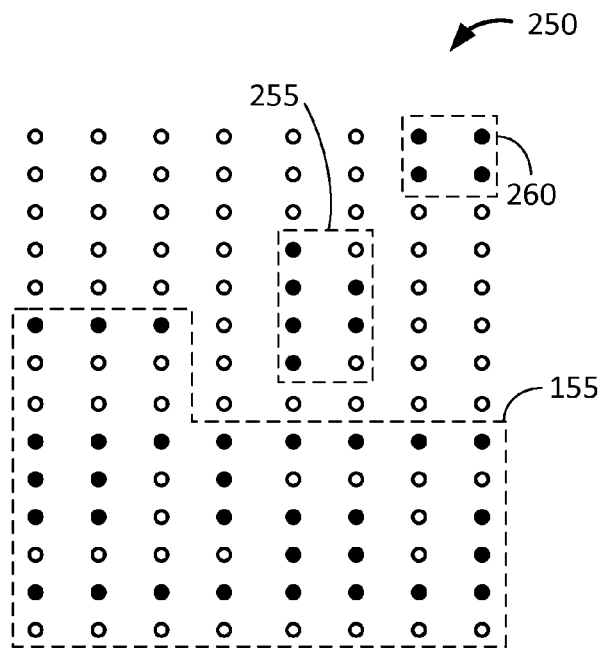
FIG. 2B illustrates a distribution of configuration random access memory (CRAM) cells associated with the schematic of FIG. 2B in accordance with some implementations.

For example, FIG. 2B illustrates a simplified example of a distribution 250 of CRAM cells associated with the schematic of FIG. 2A. The CRAM cells may be configured based on bitstream data, for example, from a configuration file. Distribution 155 is the subset of CRAM cells associated with logic design 100. Distribution 155 is undisturbed and maintained between the schematics of FIGS. 1A and 2A. Accordingly, the placement of the logic and routing of the interconnect for the components of logic design 100 are unchanged. However, distributions 255 and 260 are CRAM cells associated with the debug design (e.g., tap 235, register 240, and acquisition block 245). For example, distribution 255 may be associated with tap 235 and register 240. Distribution 260 may be associated with acquisition block 245. In an implementation, distributions 255 and 260 may be configured via partial reconfiguration such that distribution 155 is undisturbed. That is, rather than freezing the PLD, configuring all of the CRAM cells, and then resetting the system, the configuration of distribution 155 associated with logic design 100 may be maintained while the CRAM cells associated with distributions 255 and 260 may be configured by partial reconfiguration. Accordingly, logic design 100 may still be configured in the PLD while the debug design is added. Additionally, logic design 100 may be operational while the debug design is being configured during partial reconfiguration to tap an internal interconnect of logic design 100 such that the signal may be observed.

In some implementations, another configuration file with data for the added debug design may be created. The new configuration file may be compiled with the locations of CRAM cells associated with logic design 100 in FIG. 1B locked such that they have the same locations during place and route. Partial reconfiguration may then be used to include the first debug design into the original base logic design (e.g., logic design 100). For example, the first debug design may use CRAM cells that are not used by logic design 100 in FIG. 1B. In some implementations, the configuration file may also include the configuration of the original base logic design.

If tap 235 shows that interconnect 125 is not the source of the failure, then another interconnect, such as interconnect 130 may need to be sampled. Accordingly, the debug design added in FIG. 2A may be removed and a new debug design associated with interconnect 130 may be added to logic design 100. For example, FIG. 3A also illustrates a schematic of the logic design of FIG. 1A with a debug design in accordance with some implementations. The debug design of FIG. 3A may be associated with interconnect 130. Debug design includes tap 335, register 340, acquisition block 245, and the interconnect between the components.

In an implementation, some or all of the components associated with another debug design may be removed. For example, in FIG. 3A, tap 235 (and other interconnect) and register 240 are removed. However, acquisition block 245 is maintained in the PLD. In another implementation, acquisition block 245 may also be removed.

Figure 3A:
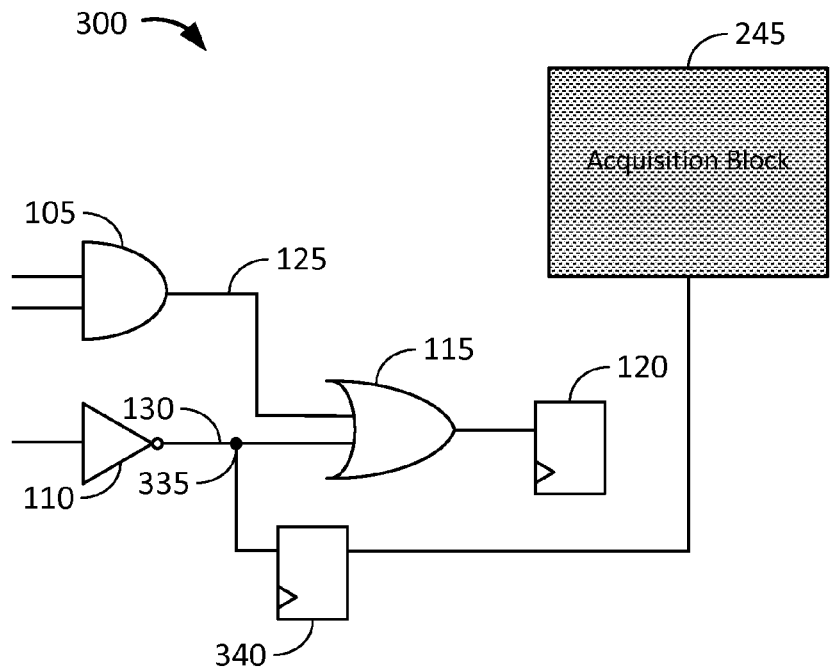
FIG. 3A illustrates a circuit schematic of the logic design of FIG. 1A with debug logic in accordance with some implementations.
Figure 3B:
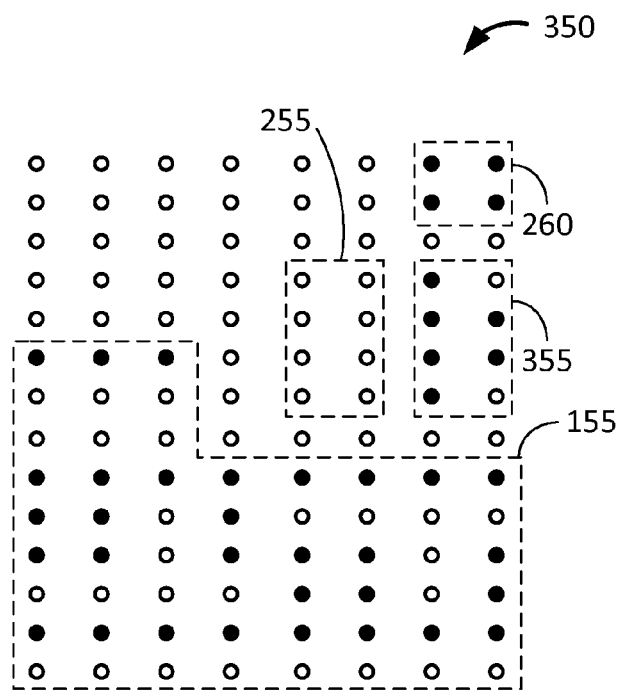
FIG. 3B illustrates a distribution of configuration random access memory (CRAM) cells associated with the schematic of FIG. 3A in accordance with some implementations.

FIG. 3B illustrates a simplified example of a distribution 350 of CRAM cells associated with the schematic of FIG. 3A. Distribution 155 is the subset of CRAM cells associated with logic design 100. Distribution 155 is undisturbed and maintained between the schematics of FIGS. 1A, 2A, and 3A. Distribution 255, associated with the CRAM cells of tap 235 and register 240 of the debug design of FIG. 2A, may be reset or reconfigured such that the functionality is removed. Distribution 260, associated with the CRAM cells of acquisition block 245, may be maintained. Distribution 355 is associated with a distribution of CRAM cells of elements of the second debug design (i.e., the debug design in FIG. 3A). Accordingly, by removing the configuration of elements from the prior debug design associated with distribution 255 and configuring distribution 355 to include the configuration of newly added debug design components of FIG. 3A, a new interconnect may be sampled. In some implementations, distribution 355 may utilize some or all of the CRAM cells previously used by distribution 255.

In some implementations, acquisition block 245 may be implemented in hard or hardened logic rather than configured in soft logic. That is, acquisition block 245 may be implemented in hardwired, or fixed, circuitry rather than being implemented by configuring CRAM cells or other types of configuration elements.

Figure 4:
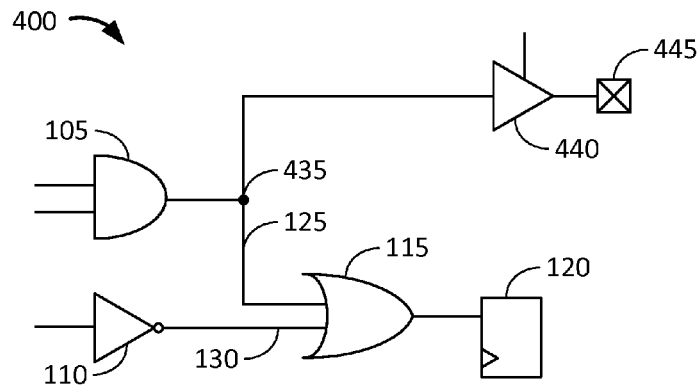
FIG. 4 illustrates a circuit schematic of a logic design with debug logic in accordance with some implementations.

The tapped signal of an interconnect may be provided to an acquisition block and stored in memory, as in FIGS. 1A-3A. However, a tapped signal may also be provided to an available I/O. For example, FIG. 4 illustrates a circuit schematic of a logic design with a debug design that routes the signal from an internal net to an I/O pin. In FIG. 4, interconnect 125 is to be observed, for example, by routing it to an unused I/O pin and observing it with an oscilloscope, logical analyzer, or other equipment or devices. Accordingly, tap 435 is added to sample interconnect 125. Tap 435 may be provided to an I/O buffer 440 which provides a signal to I/O pad 445.

Figure 5:
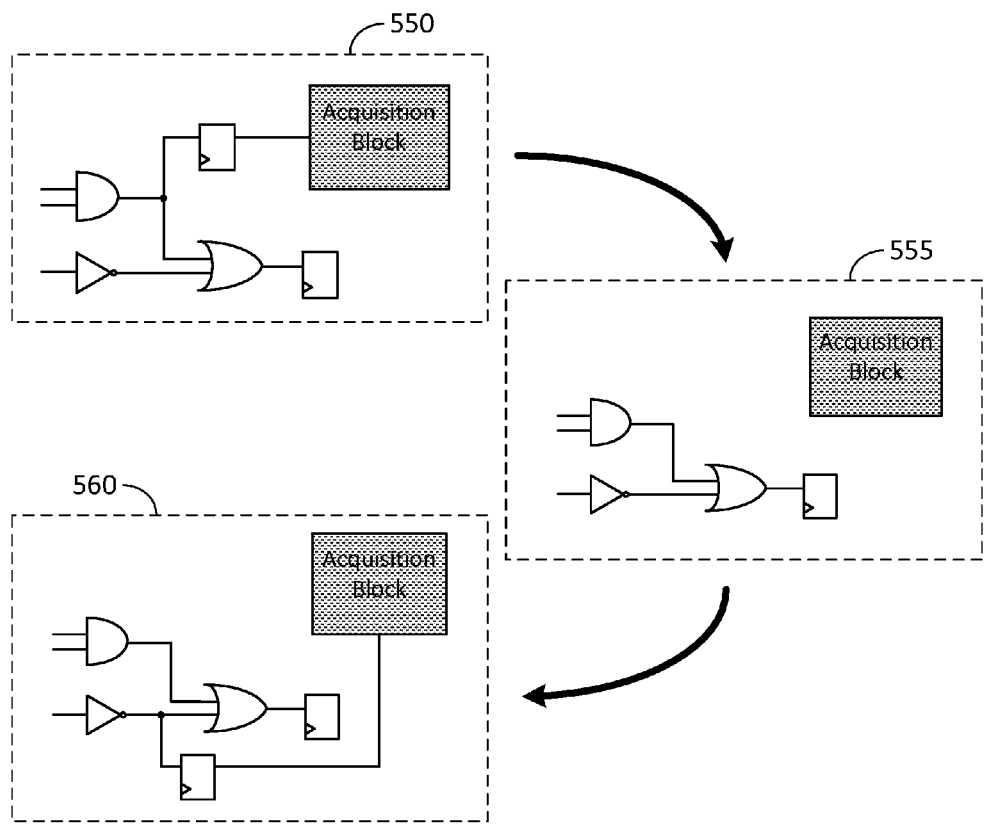
FIG. 5 illustrates a technique for transitioning between debug designs in accordance with some implementations.

FIG. 5 illustrates a technique for transitioning between debug designs in accordance with some implementations. In some implementations, transitioning from one debug design to another may include an intermediate step involving removing all of, or parts of, the first debug design before partially reconfiguring the second debug design in the PLD. Restoring a base design common to both debug designs may be useful to free placement and routing resources, prevent unwanted and/or unknown interactions between the first debug design and the second debug design, and prevent transient errors that may occur if the PLD is partially reconfigured from the first debug design to the second debug design without first reverting to the base design that is common to both debug designs.

In some implementations, the base design may be included in a data bitstream, for example, from a first configuration file. The debug designs may be included in separate data bitstreams from configuration files. For example, a PLD may first be configured with a configuration file only including the base design. When a user wishes to sample an interconnect, a new configuration file or data with the debug design added to the base design may be generated. The bitstream data associated with the CRAM cells may be provided to configuration circuitry, such as address registers and data registers, and therefore used to partially reconfigure the PLD. When a second interconnect may need to be sampled, the first configuration file with the base design may be used to configure the PLD. Next, as previously discussed, the second debug design may then be configured into the PLD with partial reconfiguration.

For example, in FIG. 5, design 550 is a first debug design. Rather than partially reconfiguring the PLD to include the second debug design, all of, or parts of, the first debug design may be removed by partial reconfiguration. In FIG. 5, design 555 may include the base design (e.g., logic design 100). Additionally, in some implementations, common logic and/or routing between the first debug design and the second debug design may be preserved. For example, in design 555 of FIG. 5, the acquisition block may be preserved because it is also present in the second debug design. Additionally, the base logic design (e.g., logic design 100) may also be preserved. Next, the second debug design may be configured into the PLD with partial reconfiguration, and therefore, the PLD is now configured to include design 560.

In some implementations, tapping a different interconnect may involve changing characteristics of the acquisition block. For example, if a first debug design taps a single interconnect, but the second debug design taps a sixteen-bit bus, the size of the acquisition block may be changed between debug designs to compensate for the change in number of sampled bits. In an implementation, if the acquisition block stores the sampled data in memory such as on-chip SRAM, then the configuration of the SRAM may be changed between debug designs. Additionally, different types of triggering logic, as explained below, may also be used between debug designs.

In an implementation, the technique of FIG. 5 may be transparent to the designer. For example, the designer may select a particular interconnect from a hierarchy of interconnects in a Graphical User Interface (GUI). When a net is selected, the debug design and configuration data may be generated and implemented into the PLD. When a second interconnect is selected, the PLD may be partially reconfigured to the original base design in the original configuration data and then subsequently partially reconfigured using another configuration data associated with the second debug design.

Figure 6:
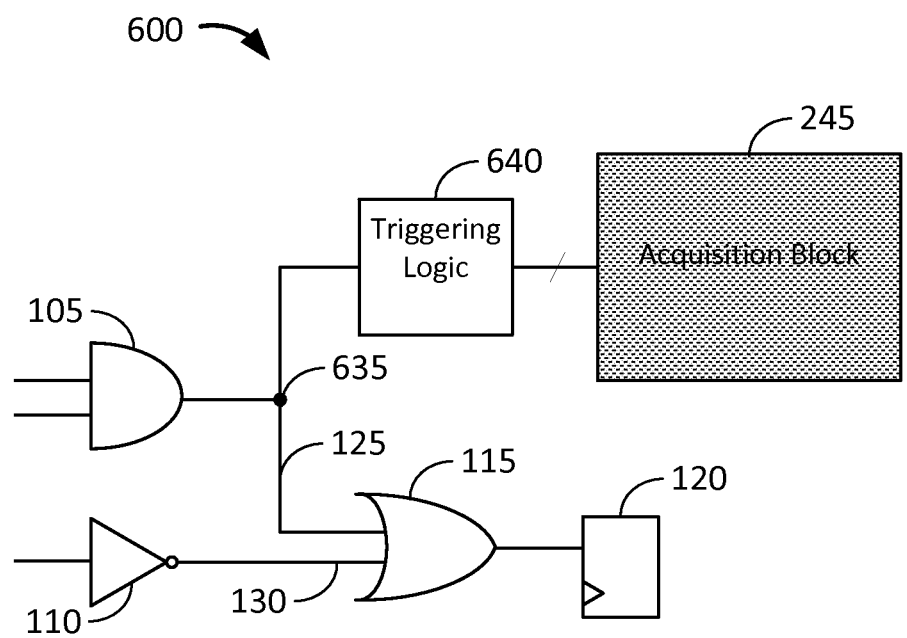
FIG. 6 illustrates a circuit schematic of a logic design with debug triggering logic in accordance with some implementations.

In some implementations, a debug design may include debug triggering logic. For example, FIG. 6 illustrates a circuit schematic of a logic design with debug triggering logic in accordance with some implementations. In FIG. 6, a debug design including tap 635, triggering logic 640, and acquisition block 245 may be added to the PLD, for example, by partial reconfiguration. Triggering logic 640 may determine a condition related to a tapped interconnect such as interconnect 125. Upon determining a condition, triggering logic 640 may assert a signal coupled to acquisition block 245. Acquisition block 245 may then begin storing sampled data from the tapped interconnect. In some implementations, acquisition block 245 may begin sampling data from the output of register 120. That is, the output of register 120 may be tapped and sampled upon a triggering of an event on another interconnect, such as interconnect 125.

In some implementations, triggering logic 640 may include logic determining whether a particular pattern has been detected at interconnect 125. For example, triggering logic may assert a signal to acquisition block 245 upon detecting five zeros in a row. Upon five flip-flops in a shift register storing five zeros, the triggering logic may assert the signal to the acquisition block to start storing sampled data from interconnect 125. As such, acquisition block 245 may receive a triggering signal from triggering logic 640 as well as sampled data from interconnect 125 (e.g., the output of the first flip-flop or register in triggering logic 640).

Additionally, in some implementations, the clock domain of sampling registers of the debug designs (e.g., register 240 of FIG. 2A or register 340 of FIG. 3A) may be the same as the sequential logic that the interconnect being tapped is a part of. For example, in FIG. 2A, register 240 may utilize the same clock as register 120. Accordingly, the sampled data may be synchronized with logic design 100.

In some implementations, a compiler may receive an indication that particular nets may be tapped, and therefore, clocks associated with the sequential logic using the interconnects may be assigned to global clocks (e.g., clocks accessible at all or most locations of the device) rather than more localized (e.g., quadrant clocks) or routed clocks. Accordingly, the sampling registers may have easier access to the appropriate clocks.

In another implementation, sampling registers may use locally routed clocks. Locally routed clocks are clocks configured to utilize the fabric routing network of the PLD. For example, a locally routed clock may use the interconnect and configuration resources of a PLD. Accordingly, a clock network may be configured rather than using a dedicated clock network. Any timing issues, such as clock skew, may be handled via timing analysis, and therefore, the elements of the debug design may be placed and routed appropriately.

In an implementation, the sampling register (e.g., register 240) may sample in the clock domain associated with logic design 100, but acquisition block 245 may operate in another clock domain.

Figure 7:
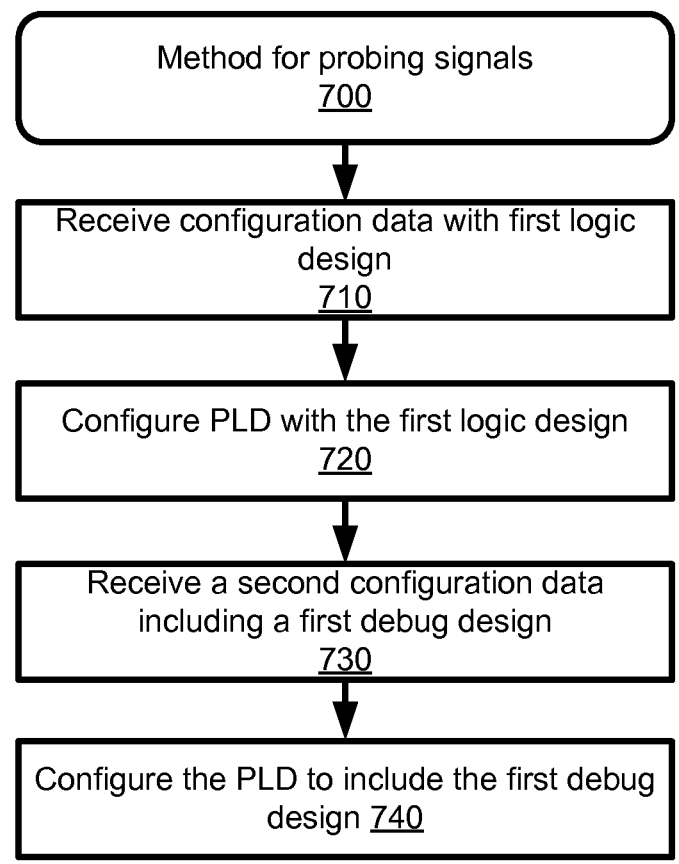
FIG. 7 is a flowchart illustrating a process flow for probing signals in accordance with some implementations.

FIG. 7 is a flowchart illustrating a process flow 700 for probing signals in accordance with some implementations. In FIG. 7, at block 710, configuration data associated with a first logic design may be received. In some implementations, the first logic design may be a base design without debug logic. In some implementations, the first logic design may be the base design with some debug logic, such as an acquisition block or memory. At block 720, the PLD may be configured with the first logic design. At block 730, a second configuration data including a debug design may be received. For example, the debug design may include an interconnect tapping another interconnect, a sampling register, triggering logic, or other components. At block 740, partial configuration may be used to configure the PLD to implement the debug design alongside the base design already implemented, and operational, in the PLD.

Figure 8:
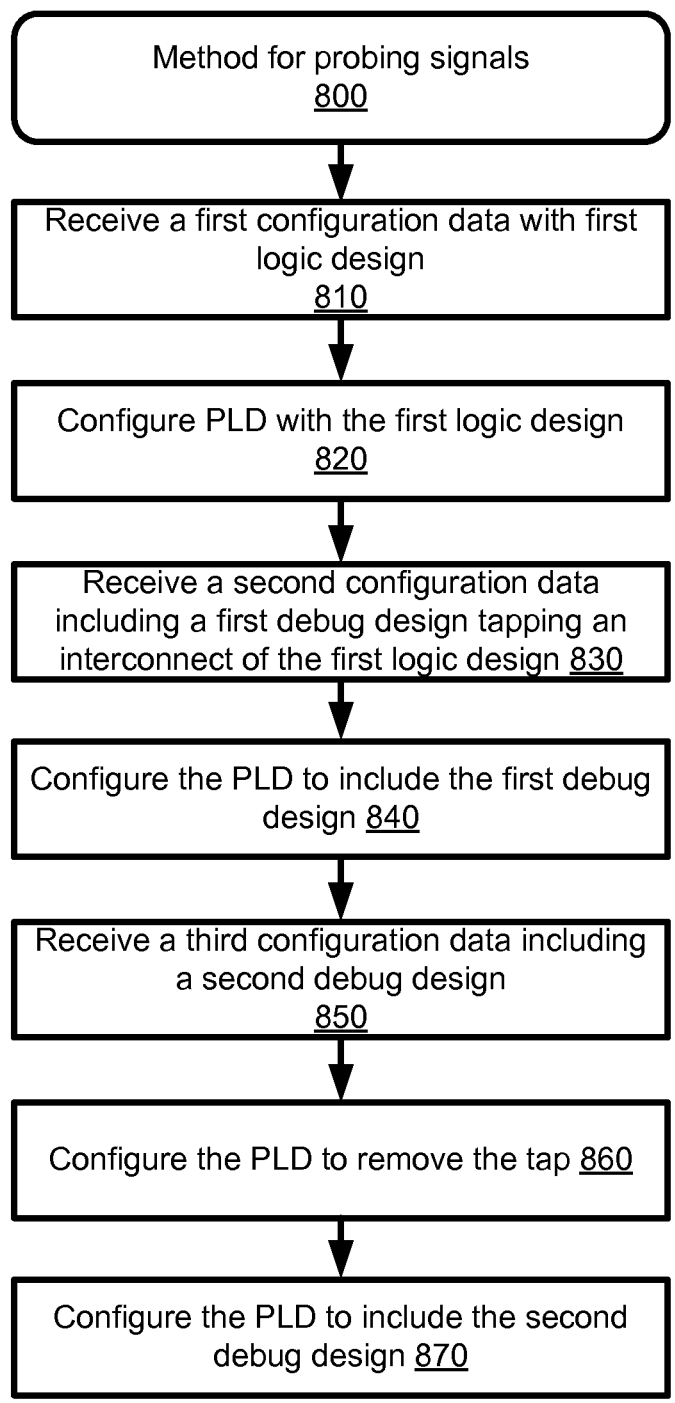
FIG. 8 is another flowchart illustrating a process flow for probing signals in accordance with some implementations.

FIG. 8 is another flowchart illustrating a process flow for probing signals in accordance with some implementations. In FIG. 8, at block 810, a first configuration data associated with a first logic design may be received by configuration circuitry in the PLD. The configuration data may be generated by a software program. As previously explained, the first logic design may be a base design without debug logic, or a design with some debug logic. At block 820, the PLD may be configured with the first logic design. For example, configuration data may be loaded into a register and used to configure CRAM cells or other configuration elements. At block 830, a second configuration data associated with a first debug design may be received by the configuration circuitry. In some implementations, the first debug design may tap an interconnect of the first logic design, as previously explained. Additional debug logic may also be included. At block 840, partial reconfiguration may be used to configure the PLD to include the first debug design. At block 850, a third configuration data associated with a second debug design may be received. At block 860, partial reconfiguration may be used to remove the tap added by the first debug design. Additional debug logic associated with the first debug design may also be removed. For example, the PLD may be configured with the first configuration data. At block 870, the second debug design may be configured into the PLD by partial reconfiguration.

In some implementations, base designs and designs including the debug designs may each be associated with their own configuration files with the appropriate bitstream data. In other implementations, a configuration file may be associated with the base design. However, the debug designs may not be associated with a configuration file. Rather, the appropriate bitstream data may be generated by a software application. For example, the appropriate bitstream data may be generated and received by the PLD when a designer selects a particular interconnect to sample in the software application.

Figure 9A:
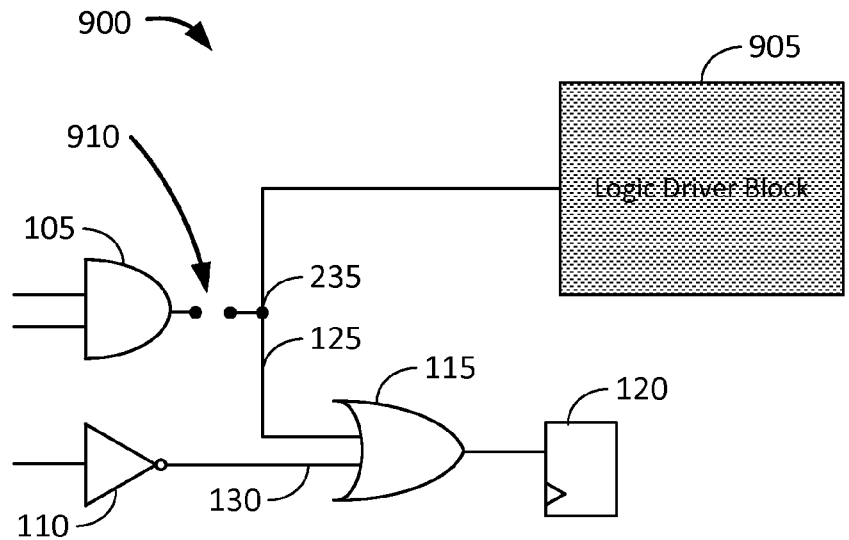
FIG. 9A illustrates a circuit schematic of the logic design of FIG. 1A with a logic driver block in accordance with some implementations.

In some implementations, "logic forcing" may be used to debug a design. For example, FIG. 9A illustrates a circuit schematic of the logic design of FIG. 1A with a logic driver block in accordance with some implementations. Logic design 900 in FIG. 9A includes logic design 100 as a base or original design. However, logic design 900 also includes logic driver block 905. Additionally, in logic design 900, AND gate 105 is disconnected from interconnect 125. That is, in logic design 900, AND gate 105 is no longer driving interconnect 125 due to discontinuity 910. Rather, logic driver block 905 drives interconnect 125 via tap 235. Accordingly, logic driver block 905 may set a particular logic level onto interconnect 125. In some implementations, logic driver block 905 may drive interconnect 125 high or low. Logic driver block 905 may also provide a pattern to be provided on interconnect 125. As such, the functionality of the design may be tested with the output provided by logic driver 905.

Figure 9B:
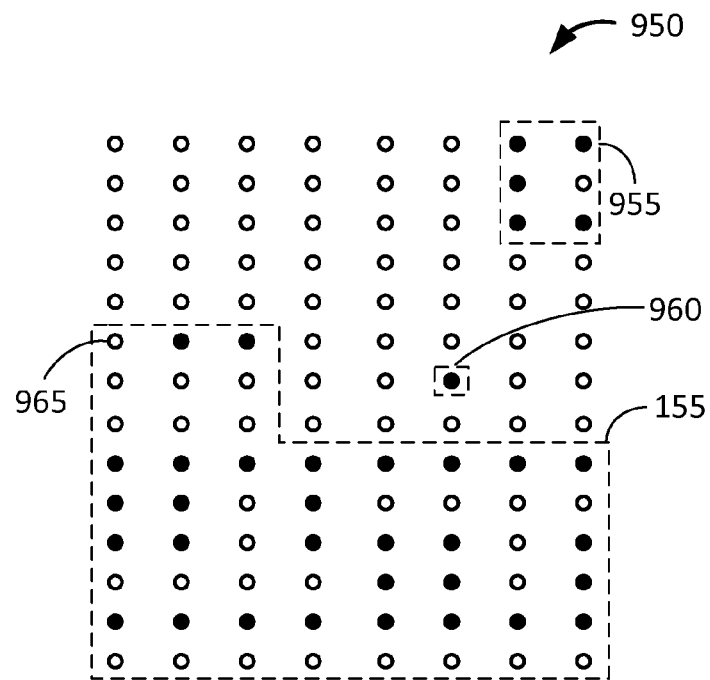
FIG. 9B illustrates a distribution of configuration random access memory (CRAM) cells associated with the schematic of FIG. 9A in accordance with some implementations.

FIG. 9B illustrates a simplified example of a distribution 900 of configuration random access memory (CRAM) cells associated with the schematic of FIG. 9A in accordance with some implementations. In FIG. 9B, distribution 955 is the subset of CRAM cells associated with logic driver block 905. Distribution 960 is the subset of CRAM cells associated with tap 235. Distribution 155 is the subset of CRAM cells associated with the base or original design (e.g., logic design 100). However, in distribution 155 in FIG. 9B, the state of CRAM cell 965 may be changed in comparison to distribution 150 in FIG. 1B. That is, the CRAM cells associated with logic design 100 may be slightly altered in configuration in distribution 950. For example, changing the state of CRAM cell 965 may be associated with discontinuity 910, and therefore, AND gate 105 may no longer be coupled to interconnect 125 and/or OR gate 115.

In an implementation, if another interconnect is needed to be "logic forced," then the techniques explained previously, for example with FIG. 5, may be used to transition between debug designs. In some implementations, the base design may be logic design 100 of FIG. 1A (i.e., the design without discontinuity 910). Additionally, as previously discussed with respect to the acquisition block in FIG. 5, in some implementations, logic driver block 905 and other common logic or routing may also be preserved while transitioning between debug designs.

In some implementations, a combination of logic driver block 905 and acquisition block 245 may be used. For example, logic driver block 905 may provide a particular logic level or pattern to one interconnect and acquisition block 245 may tap another interconnect.

The techniques and circuits disclosed herein may be implemented with partial reconfiguration. However, other configuration techniques may also be used. For example, a full reconfiguration without a "freeze" that guarantees that the existing configuration is not disturbed may be used. That is, configuration methodologies which do not glitch or disrupt an existing running implementation may implement the examples of the techniques and circuits disclosed herein.

Figure 10:
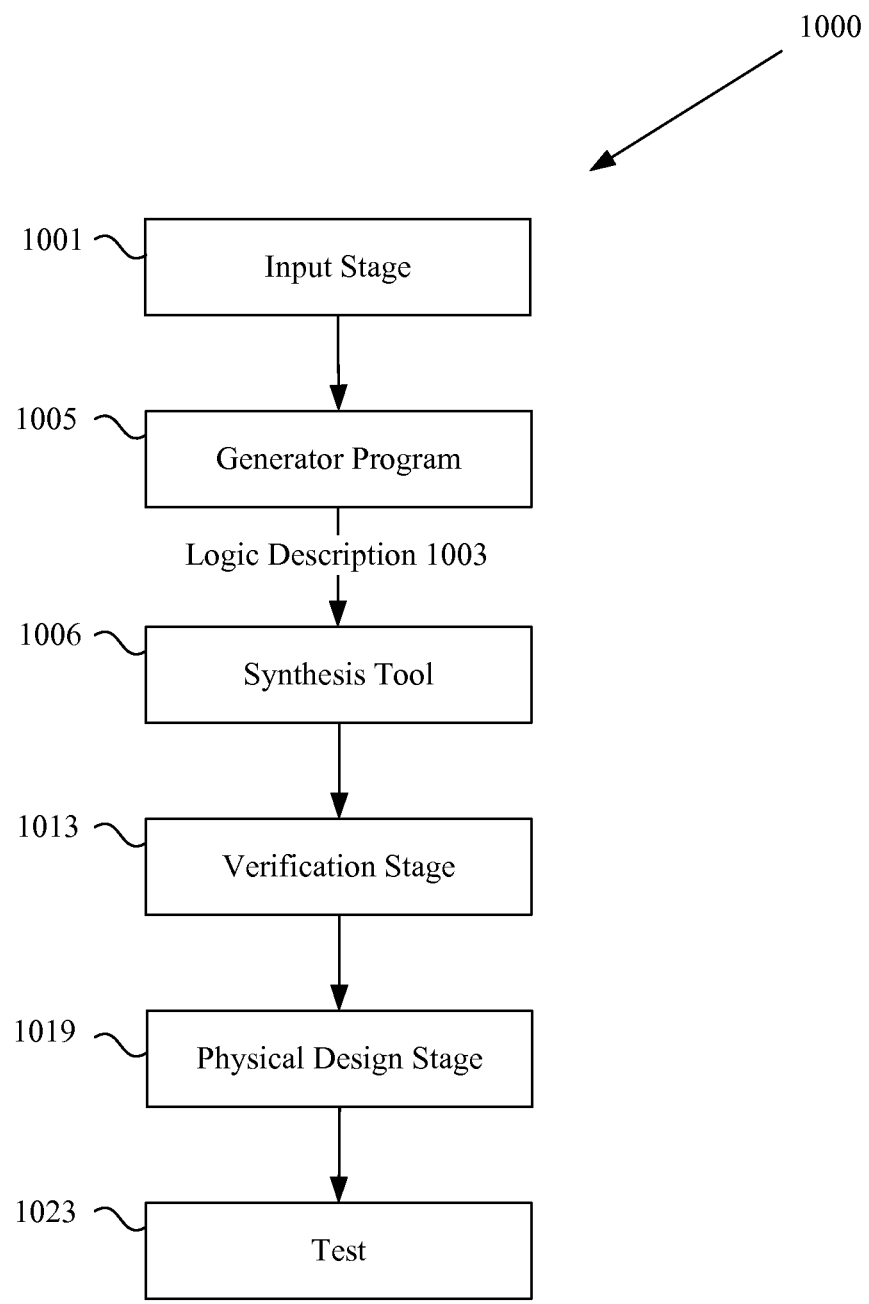
FIG. 10 illustrates a technique for implementing a programmable chip.

FIG. 10 illustrates a technique for implementing a programmable chip. An input stage 1001 receives selection information typically from a user for logic such as a processor core as well as other components to be implemented on an electronic device. In one example, the input received is in the form of a high-level language program. A generator program 1005 creates a logic description and provides the logic description along with other customized logic to any of a variety of synthesis tools, place and route programs, and logic configuration tools to allow a logic description to be implemented on an electronic device.

In one example, an input stage 1001 often allows selection and parameterization of components to be used on an electronic device. The input stage 1001 also allows configuration of hard coded logic. In some examples, components provided to an input stage include intellectual property functions, megafunctions, and intellectual property cores. The input stage 1001 may be a graphical user interface using wizards for allowing efficient or convenient entry of information. The input stage may also be a text interface or a program reading a data file such as a spreadsheet, database table, or schematic to acquire selection information. The input stage 1001 produces an output containing information about the various modules selected. At this stage, the user may enter security information about individual components that needs to be isolated. For example, different levels of component security and which components are allowed to communicate with each other may be entered.

In typical implementations, the generator program 1005 can identify the selections and generate a logic description with information for implementing the various modules. The generator program 1005 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 1005 identifies pointers and provides ports for each pointer. One tool with generator program capabilities is System on a Programmable Chip (SOPC) Builder available from Altera Corporation of San Jose, Calif. The generator program 1005 also provides information to a synthesis tool 1007 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool.

As will be appreciated by one of skill in the art, the input stage 1001, generator program 1005, and synthesis tool 1007 can be separate programs. The interface between the separate programs can be a database file, a log, or simply messages transmitted between the programs. For example, instead of writing a file to storage, the input stage 1001 can send messages directly to the generator program 1005 to allow the generator program to create a logic description. Similarly, the generator program can provide information directly to the synthesis tool instead of writing HDL files. Similarly, input stage 1001, generator program 1005, and synthesis tool 1007 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 1007.

A synthesis tool 1007 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 1013 typically follows the synthesis stage 1007. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 1013, the synthesized netlist file can be provided to physical design tools 1019 including place and route and configuration tools. A place and route tool locates logic cells on specific logic elements of a target hardware device and connects wires between the inputs and outputs of the various logic elements in accordance with logic and security provided to implement an electronic design. According to various embodiments of the present invention, the place and route tool may perform the techniques of the present invention to implement the various security requirements and rules as defined by the user. The iterative technique may be transparent to the user, but the resulting device can be physically tested at 1023.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be used using various techniques of the present invention.

As noted above, different stages and programs can be integrated in a variety of manners. According to one embodiment, the input stage 1001, the generator program 1005, the synthesis tool 1007, the verification tools 1013, and physical design tools 1019 are integrated into a single program. The various stages are automatically run and transparent to a user. The program can receive the user-selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 11:
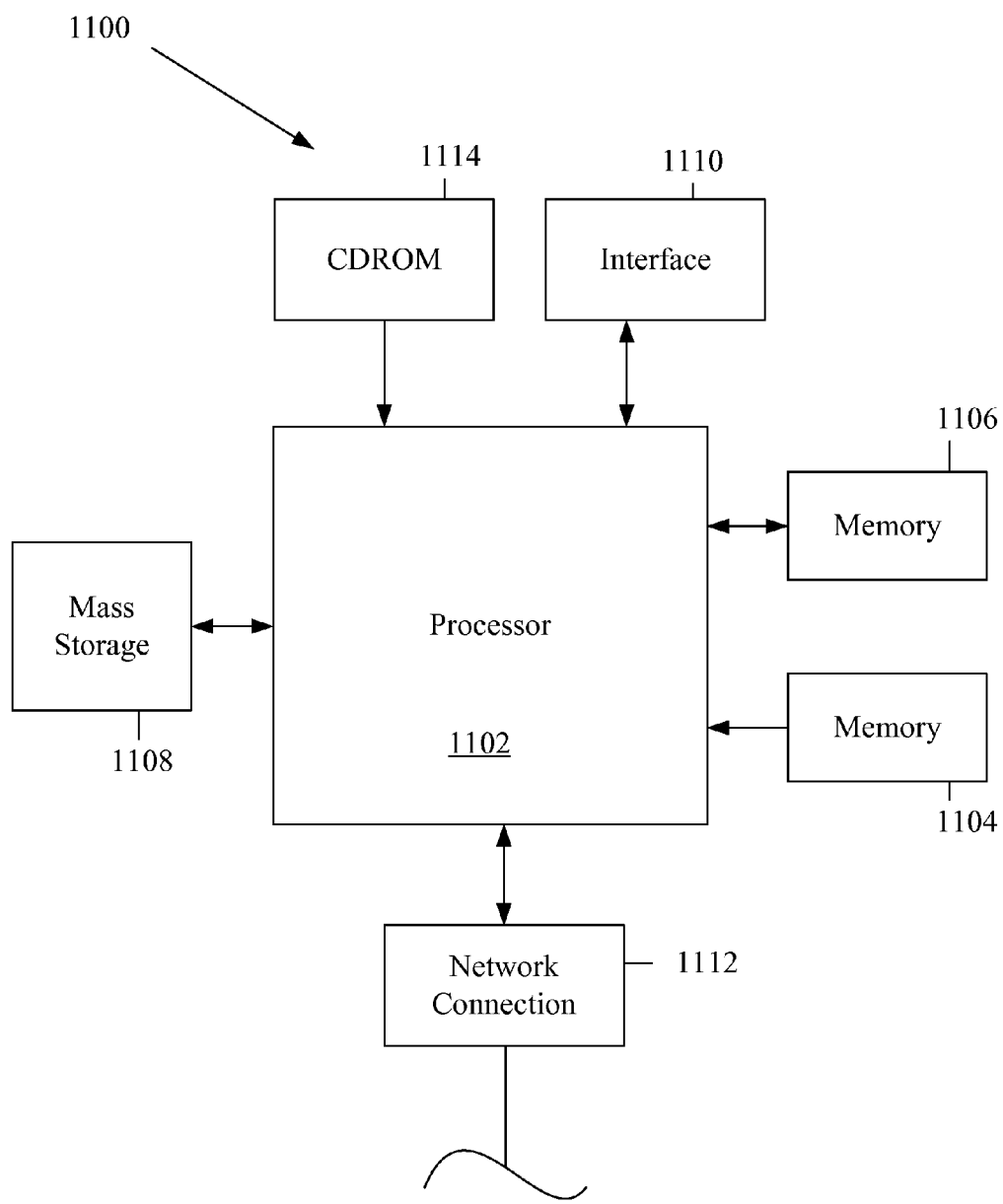
FIG. 11 illustrates one example of a computer system.

FIG. 11 illustrates one example of a computer system. The computer system 1100 includes any number of processors 1102 (also referred to as central processing units, or CPUs) that are coupled to devices including memory 1106 (typically a random access memory, or "RAM"), memory 1104 (typically a read only memory, or "ROM"). The processors 1102 can be configured to generate an electronic design. As is well known in the art, memory 1104 acts to transfer data and instructions uni-directionally to the CPU and memory 1106 are used typically to transfer data and instructions in a bi-directional manner.

Both of these memory devices may include any suitable type of the computer-readable media described above. A mass storage device 1108 is also coupled bi-directionally to CPU 1102 and provides additional data storage capacity and may include any of the computer-readable media described above. The mass storage device 1108 may be used to store programs, data and the like and is typically a secondary storage medium such as a hard disk that is slower than memory. The mass storage device 1108 can be used to hold a library or database of prepackaged logic or intellectual property functions, as well as information on generating particular configurations. It will be appreciated that the information retained within the mass storage device 1108, may, in appropriate cases, be incorporated in standard fashion as part of memory 1106 as virtual memory. A specific mass storage device such as a CD-ROM 1114 may also pass data uni-directionally to the CPU.

CPU 1102 is also coupled to an interface 1110 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. The CPU 1102 may be a design tool processor. Finally, CPU 1102 optionally may be coupled to a computer or telecommunications network using a network connection as shown generally at 1112. With such a network connection, it is contemplated that the CPU might receive information from the network, or might output information to the network in the course of performing the above-described process steps. It should be noted that the system 1100 might also be associated with devices for transferring completed designs onto a programmable chip. The above-described devices and materials will be familiar to those of skill in the computer hardware and software arts.

Although many of the components and processes are described above in the singular for convenience, it will be appreciated by one of skill in the art that multiple components and repeated processes can also be used to practice the techniques of the present invention.

While particular embodiments of the invention have been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention

What is claimed is:

1. A method for probing signals of a device having configuration elements, the method comprising:
    transmitting, to the device, a first configuration data to configure the device, the first configuration data including a first logic design, wherein the first configuration data corresponds to a first subset of the configuration elements;
    generating, by a processor, a second configuration data including a first debug design, wherein the first debug design includes a first tap of a first interconnect of the first logic design, wherein the second configuration data corresponds to a second subset of the configuration elements, wherein the first subset of the configuration elements includes different configuration elements than the second subset of the configuration elements, and the first debug design includes an acquisition block to store data corresponding to the first tap of the first interconnect;
    transmitting, to the device, the second configuration data to configure the device, the second configuration data including the first debug design;
    generating, by the processor, a third configuration data including a second debug design, the second debug design includes a second tap of a second interconnect of the first logic design, and the acquisition block to store data corresponding to the second tap of the second interconnect;
    transmitting, to the device, data to remove the first tap of the first debug design from the device and maintain the first logic design and the acquisition block; and
    transmitting, to the device, the third configuration data to configure the device after the removal of the first tap of the first debug design, the third configuration data including the second debug design.

2. The method of claim 1, wherein the second configuration data including the first debug design maintains the configuration of the first logic design.

3. The method of claim 1, wherein the first debug design includes a register with an input, the input coupled with the first tap of the first interconnect.

4. The method of claim 3, wherein the register includes an output providing sampled data of the first interconnect, the sampled data of the register provided to an input of the acquisition block, the acquisition block configured to store sampled data.

5. The method of claim 4, wherein the sampled data is stored in off-chip memory.

6. The method of claim 1, wherein the first tap of the first interconnect is coupled with an output of the device.

7. The method of claim 1, wherein the first debug design further includes triggering logic coupled with the first tap and the acquisition block.

8. The method of claim 7, wherein the triggering logic provides a trigger signal to the acquisition block.

9. The method of claim 8, wherein the acquisition block stores data when the trigger signal is asserted.

10. The method of claim 1, wherein a size of the acquisition block corresponds to a bit width of the first interconnect.

11. The method of claim 10, wherein the third configuration data adjusts the size of the acquisition block based on the bit width of the second interconnect.

12. The method of claim 11, wherein the second tap of the second interconnect is coupled with the acquisition block.

13. The method of claim 12, wherein the acquisition block is configured in the device.

14. The method of claim 11, wherein the first configuration data provides a configuration of the first subset of the configuration elements, the first subset of the configuration elements associated with the first logic design.

15. The method of claim 14, wherein the third configuration data maintains the configuration of the first subset of the configuration elements associated with the first logic design.

16. The method of claim 1, wherein the first subset does not include any of the configuration elements of the second subset.

17. A circuit for configuring a device having configuration elements, the circuit comprising:
configuration circuitry for:
receiving, on the device, a first configuration data including a first logic design, wherein the first configuration data corresponds to a first subset of the configuration elements;
configuring the device to include the first logic design;
receiving, on the device, a second configuration data including a first debug design, wherein the first debug design includes a first tap of a first interconnect of the first logic design, wherein the second configuration data corresponds to a second subset of the configuration elements, wherein the first subset of the configuration elements includes different configuration elements than the second subset of the configuration elements, and the first debug design includes an acquisition block to store data corresponding to the first tap of the first interconnect;
configuring the device to include the first debug design;
receiving data to remove the first tap of the first debug design from the device and maintain the first logic design and the acquisition block;
configuring the device to remove the first tap of the first debug design and maintain the first logic design and the acquisition block;
receiving a third configuration data including a second debug design, the second debug design includes a second tap of a second interconnect of the first logic design, and the acquisition block to store data corresponding to the second tap of the second interconnect;
configuring the device to include the second debug design after the removal of the first tap of the first debug design.

18. The circuit of claim 17,
wherein the second configuration data including the first debug design maintains the configuration of the first logic design.

19. A method for probing signals of a device having configuration elements, the method comprising:
receiving, on the device, a first configuration data including a first logic design, wherein the first configuration data corresponds to a first subset of the configuration elements;
configuring the device to include the first logic design;
receiving, on the device, a second configuration data including a first debug design, wherein the first debug design includes a first tap of a first interconnect of the first logic design, wherein the second configuration data corresponds to a second subset of the configuration elements, and wherein the first subset of the configuration elements includes different configuration elements than the second subset of the configuration elements, and the first debug design includes an acquisition block to store data corresponding to the first tap of the first interconnect;
configuring the device to include the first debug design;
receiving data to remove the first tap of the first debug design from the device and maintain the first logic design and the acquisition block;
configuring the device to remove the first tap of the first debug design and maintain the first logic design and the acquisition block;
receiving a third configuration data including a second debug design, the second debug design includes a second tap of a second interconnect of the first logic design, and the acquisition block to store data corresponding to the second tap of the second interconnect; and
configuring the device to include the second debug design after the removal of the first tap of the first debug design.

20. The method of claim 19,
wherein the second configuration data including the first debug design maintains the configuration of the first logic design.

21. A non-transitory computer readable medium having instructions stored thereon, the instructions executable by a processor to:
transmit, to a device having configuration elements, a first configuration data to configure the device, the first configuration data including a first logic design, wherein the first configuration data corresponds to a first subset of the configuration elements;
generate, by the processor, a second configuration data including a first debug design, wherein the first debug design includes a first tap of a first interconnect of the first logic design, wherein the second configuration data corresponds to a second subset of the configuration elements, and wherein the first subset of the configuration elements includes different configuration elements than the second subset of the configuration elements, and the first debug design includes an acquisition block to store data corresponding to the first tap of the first interconnect;
transmit, to the device, the second configuration data to configure the device, the second configuration data including the first debug design;
generate, by the processor, a third configuration data including a second debug design, the second debug design includes a second tap of a second interconnect of the first logic design, and the acquisition block to store data corresponding to the second tap of the second interconnect;
transmit, to the device, data to remove the first tap of the first debug design from the device and maintain the first logic design and the acquisition block; and transmit, to the device, the third configuration data to configure the device after the removal of the first tap of the first debug design, the third configuration data including the second debug design.

22. The non-transitory computer readable medium of claim 21, wherein the second configuration data including the first debug design maintains the configuration of the first logic design.

* * * * *